United States Patent
Nagatomo

(10) Patent No.: US 12,506,460 B2
(45) Date of Patent: Dec. 23, 2025

(54) ACOUSTIC WAVE DEVICE

(71) Applicant: Murata Manufacturing Co., Ltd., Nagaokakyo (JP)

(72) Inventor: Sho Nagatomo, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 741 days.

(21) Appl. No.: 17/953,379

(22) Filed: Sep. 27, 2022

(65) Prior Publication Data

US 2023/0018882 A1    Jan. 19, 2023

Related U.S. Application Data

(63) Continuation of application No. PCT/JP2021/012228, filed on Mar. 24, 2021.

(30) Foreign Application Priority Data

Mar. 31, 2020    (JP) ................ 2020-062202

(51) Int. Cl.
*H03H 9/00*    (2006.01)
*H03H 9/02*    (2006.01)
*H03H 9/145*    (2006.01)

(52) U.S. Cl.
CPC .... *H03H 9/02818* (2013.01); *H03H 9/02566* (2013.01); *H03H 9/02724* (2013.01); *H03H 9/02992* (2013.01); *H03H 9/145* (2013.01)

(58) Field of Classification Search
CPC ........... H03H 9/02818; H03H 9/02566; H03H 9/02724; H03H 9/02992; H03H 9/145; H03H 9/14544
See application file for complete search history.

(56) References Cited

U.S. PATENT DOCUMENTS

2002/0153970 A1    10/2002    Noto
2009/0174285 A1    7/2009    Kando
(Continued)

FOREIGN PATENT DOCUMENTS

JP    2002314366 A    10/2002
JP    2006319887 A    11/2006
(Continued)

OTHER PUBLICATIONS

Office Action in JP2022-512023, mailed Jun. 13, 2023, 5 pages.
(Continued)

*Primary Examiner* — Julio C. Gonzalez
(74) *Attorney, Agent, or Firm* — Keating & Bennett, LLP

(57) ABSTRACT

An IDT electrode includes first and second busbar electrodes opposed to each other, first and second electrode fingers extending respectively from the first and second busbar electrodes on a piezoelectric substrate. The first busbar electrode and a tip end of the second electrode finger are opposed to each other with a gap therebetween, and bottom surfaces of the first and second busbar electrodes are opposed to each other with a first gap therebetween. The first and second busbar electrodes respectively include portions opposed to each other with a second gap shorter than the first gap therebetween on the top surface side. In a first area located between a first side surface and a second side surface, a second area located between the piezoelectric substrate and the first busbar electrode or the second electrode finger includes a hollow portion.

20 Claims, 8 Drawing Sheets

(56) References Cited

U.S. PATENT DOCUMENTS

| | | | |
|---|---|---|---|
| 2017/0264269 A1 | 9/2017 | Lee et al. | |
| 2019/0097602 A1 | 3/2019 | Kimura | |
| 2019/0199320 A1 | 6/2019 | Morita et al. | |
| 2020/0295730 A1 | 9/2020 | Nagatomo et al. | |
| 2021/0143796 A1 | 5/2021 | Takata | |
| 2022/0345108 A1* | 10/2022 | Nagatomo | H03H 9/14544 |
| 2024/0014793 A1* | 1/2024 | Inoue | H03H 9/02228 |

FOREIGN PATENT DOCUMENTS

| | | | |
|---|---|---|---|
| JP | 2014110457 A | 6/2014 | |
| JP | 2014143657 A | 8/2014 | |
| JP | 2019062441 A | 4/2019 | |
| JP | 2019114986 A | 7/2019 | |
| WO | 2008038506 A1 | 4/2008 | |
| WO | 2010137648 A1 | 12/2010 | |
| WO | 2018057956 A1 | 3/2018 | |
| WO | 2019111664 A1 | 6/2019 | |
| WO | 2020036100 A1 | 2/2020 | |

OTHER PUBLICATIONS

International Search Report in PCT/JP2021/012228, mailed May 25, 2021, 3 pages.
Written Opinion in PCT/JP2021/012228, mailed May 25, 2021, 3 pages.

\* cited by examiner

ACOUSTIC WAVE DEVICE

CROSS REFERENCE TO RELATED APPLICATIONS

This application claims the benefit of priority to Japanese Patent Application No. 2020-062202 filed on Mar. 31, 2020 and is a Continuation Application of PCT Application No. PCT/JP2021/012228 filed on Mar. 24, 2021. The entire contents of each application are hereby incorporated herein by reference.

BACKGROUND OF THE INVENTION

1. Field of the Invention

The present disclosure relates to an acoustic wave device.

2. Description of the Related Art

There has been known a surface acoustic wave element including a piezoelectric substrate and at least one IDT electrode provided to the piezoelectric substrate as described in Japanese Unexamined Patent Application Publication No. 2014-143657. The IDT electrode includes a pair of a first comb-shaped electrode and a second comb-shaped electrode. Each comb-shaped electrode has a busbar electrode and a plurality of electrode fingers which extend from the busbar electrode and whose tip ends are located to have a gap from the other comb-shaped electrode.

Conventionally, in the surface acoustic wave element, there is a case where, when an electric field is generated in the gap, distorted current occurs due to nonlinearity of the piezoelectric substrate, and electrical characteristics decrease due to a distorted wave based on the distorted current.

In this respect, for example, Japanese Unexamined Patent Application Publication No. 2014-143657 describes a technology in which an insulation film having a permittivity lower than that of the piezoelectric substrate is disposed between the busbar electrode and the piezoelectric substrate. Therefore, it is disclosed that the electric field concentrates on the insulation film and the electric field generated in the gap is weakened, thus the distorted wave being suppressed.

In the acoustic wave device described in Japanese Unexamined Patent Application Publication No. 2014-143657, in order to sufficiently reduce the electric field generated in the gap, it is required to increase the thickness of the insulation film and cause a lot of electric fields to concentrate thereon. However, in this case, there is a problem in that an electromechanical coupling coefficient decreases and the characteristics of the acoustic wave device degrade.

SUMMARY OF THE INVENTION

Preferred embodiments of the present invention provide acoustic wave devices each of which are each able to achieve both of reducing or preventing the distorted wave by reducing the electric field generated in the gap and reducing or preventing degradation of the characteristics.

An acoustic wave device according to a preferred embodiment of the present invention includes a piezoelectric substrate and an IDT electrode on the piezoelectric substrate. The IDT electrode includes a pair of busbar electrodes opposed to each other and a plurality of electrode fingers. Each of the plurality of electrode fingers is connected at one end portion to one of the pair of busbar electrodes, and is opposed at another end portion to another one of the pair of busbar electrodes with a gap therebetween. At least one of an opposing surface of the busbar electrode and an opposing surface of the electrode finger, the opposing surfaces being opposed to each other with the gap therebetween, includes a convex portion projecting toward the gap side from a portion separated from the piezoelectric substrate such that a distance of the gap is shorter at the portion separated from the piezoelectric substrate compared to at a portion in contact with the piezoelectric substrate. A hollow portion exists between the convex portion and the piezoelectric substrate.

According to preferred embodiments of the present invention, distorted waves are able to be reduced or prevented by reducing an intensity of the electric field generated in the gap in the piezoelectric substrate while reducing or preventing degradation of the characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
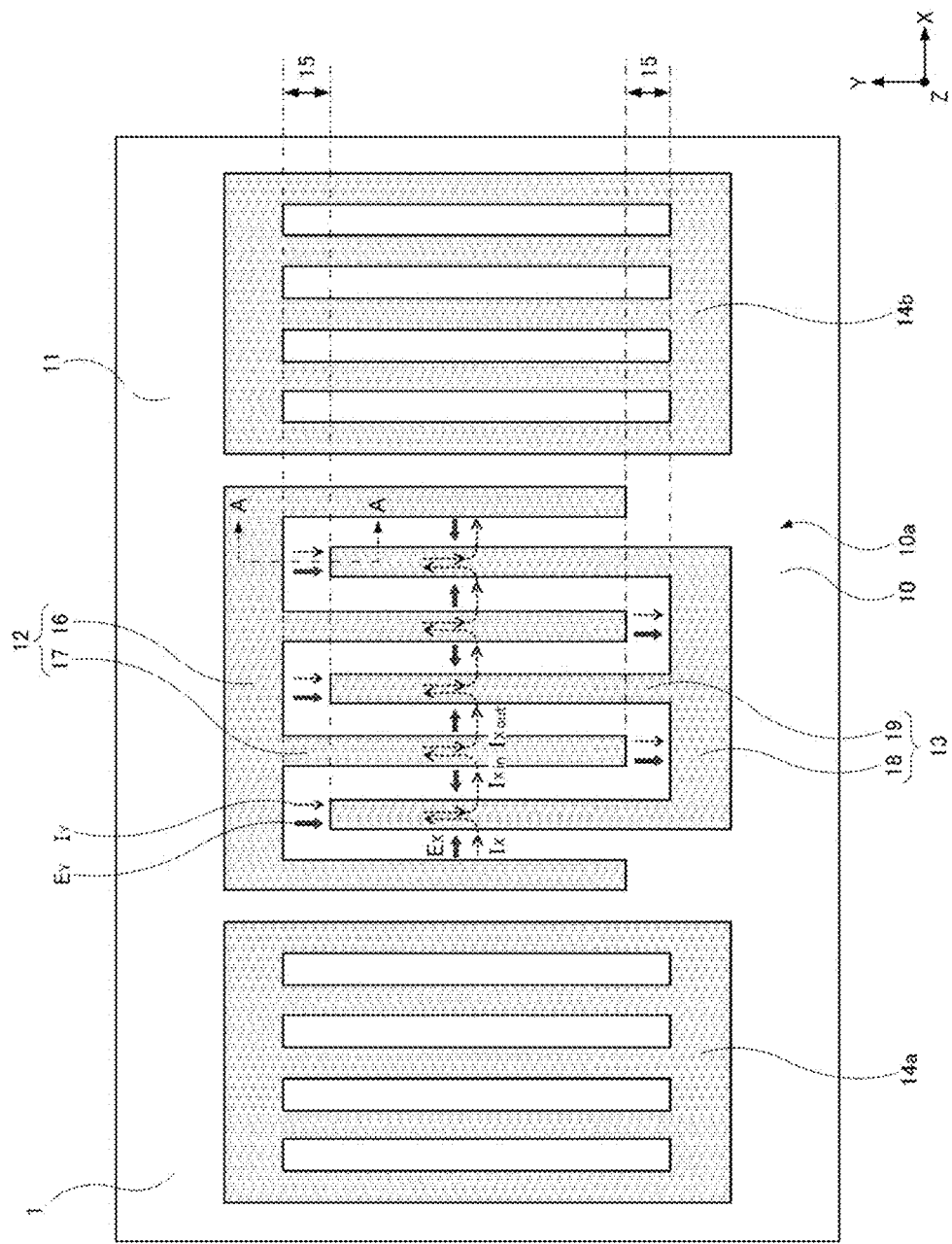
FIG. 1 is a plan view illustrating an acoustic wave device according to a preferred embodiment of the present invention.

Hereinafter, examples of preferred embodiments of the present invention are described. However, the preferred embodiments described below are merely illustrative and the present invention is not limited by the preferred embodiments described below.

Furthermore, in the drawings which are referred to in the preferred embodiments or the like, the same reference characters denote elements and features having the same or substantially the same functions. The drawings referred to in the preferred embodiments or the like are schematically illustrated, and dimensional ratios or the like of elements and features illustrated in the drawings may be different from dimensional ratios of actual elements and features. In addition, the dimensional ratios of elements and features or the like may be different between the drawings. Concrete dimensional ratios of the elements and features or the like should be construed in consideration of the following description.

In the description and claims, an upper side and a lower side of an acoustic wave device may be any direction. However, for convenience, the Cartesian coordinate system xyz is defined and terms "upper side", "lower side", "up", "down", and the like may be used below assuming that a positive side in a z-direction (the upper side of the drawing sheet of FIGS. 2A and 2B) is the "upper side" and a negative side in the z-direction (the lower side of the drawing sheet of FIGS. 2A and 2B) is the "lower side".

Here, the terms "top surface" and "bottom surface" are referred to indicate arbitrary surfaces of an IDT electrode 11. Specifically, the terms "bottom surface", "top surface", and the like are used assuming that a surface of the IDT electrode 11 on a piezoelectric substrate 10 side is the "bottom surface" and a surface opposed to the bottom surface of the IDT electrode 11 is the "top surface". In other words, when the definition of the "upper side" and the "lower side" as described above is used, the top surface is located on the upper side of the bottom surface, and the bottom surface is located on the lower side of the top surface. In addition, a "side surface" indicates a surface extending between the top surface and the bottom surface among the surfaces of the IDT electrode 11. In other words, a surface which is not the top surface or the bottom surface among the surfaces of the IDT electrode 11 is defined as a side surface.

Preferred Embodiment 1

FIG. 1 is a plan view of an acoustic wave device 1 according to a preferred embodiment of the present invention. Note that the acoustic wave device 1 according to the preferred embodiment of the present invention is, for example, a surface acoustic wave device. As illustrated in FIG. 1, the acoustic wave device 1 includes a piezoelectric substrate 10. The piezoelectric substrate 10 is made of, for example, lithium tantalate. The piezoelectric substrate 10 may be made of piezoelectric single crystals other than lithium tantalate (for example, lithium niobate), or suitable piezoelectric ceramics.

As illustrated in FIG. 1, the piezoelectric substrate 10 includes a principal surface 10a, and the IDT electrode 11 is provided on the principal surface 10a. By applying alternating current voltage to the IDT electrode 11, an acoustic wave is excited. On both sides of the IDT electrode 11 in an acoustic wave propagation direction (x-direction), reflectors 14 including a reflector 14a and a reflector 14b are respectively provided. The reflector 14a and the reflector 14b extend in a direction (y-direction) orthogonal or substantially orthogonal to the acoustic wave propagation direction (x-direction), and each of the reflector 14a and the reflector 14b includes a plurality of reflective electrode fingers parallel or substantially parallel to each other.

The IDT electrode 11 includes a first busbar electrode 16 and a second busbar electrode 18 which are opposed to each other. In addition, the IDT electrode 11 includes a plurality of first electrode fingers 17 and a plurality of second electrode fingers 19. Each first electrode finger 17 is connected at one end to the first busbar electrode 16 and extends toward the second busbar electrode 18. Each second electrode finger 19 is connected at one end to the second busbar electrode 18 and extends toward the first busbar electrode 16. The first busbar electrode 16 and the first electrode fingers 17 define a first comb-shaped electrode 12, and the second busbar electrode 18 and the second electrode fingers 19 define a second comb-shaped electrode 13. Below, the first comb-shaped electrode 12 and the second comb-shaped electrode 13 may simply be referred to as a comb-shaped electrode, and sometimes they are not distinguished.

The plurality of first electrode fingers 17 and the plurality of second electrode fingers 19 are interdigitated with each other. That is, in one pair of comb-shaped electrodes, the plurality of first electrode fingers 17 and the plurality of second electrode fingers 19 are disposed so as to be interdigitated with each other. However, it is unnecessary that all of the plurality of first electrode fingers 17 and the plurality of second electrode fingers 19 are interdigitated with each other as long as some of them are interdigitated with each other.

In addition, the first busbar electrode 16 and tip-end portions of the plurality of second electrode fingers 19 (or the second busbar electrode 18 and tip-end portions of the plurality of first electrode fingers 17) are opposed to each other with a gap 15 therebetween in the direction (in FIG. 1, y-direction) orthogonal or substantially orthogonal to the acoustic wave propagation direction (in FIG. 1, x-direction).

Here, each of the first busbar electrode 16 and the second busbar electrode 18 may include a dummy electrode finger extending toward the opposing busbar electrode. In this case, the dummy electrode finger is included in the busbar electrode in the following description. Even if the dummy electrode finger and the busbar electrode are treated as different, advantageous effects achieved by preferred embodiments of the present invention are the same or substantially the same. Therefore, separate description and a paraphrase for the dummy electrode finger are omitted.

The IDT electrode 11 includes a laminated metallic film in which a plurality of metallic layers are laminated. The metal is, for example, Al, W, Mo, Ta, Hf, Cu, Pt, Ti, Au, Ag, Ni, Zn, or Cr, or alloy including at least one of these metals as a main element. The IDT electrode may include a single metallic layer.

Assuming that a center-to-center distance between adjacent first electrode fingers 17 in the x-direction is an IDT electrode pitch p, a thickness of the piezoelectric substrate 10 is preferably about 2p or less, for example. In this case, the piezoelectric substrate 10 may be laminated on a supporting substrate. In this manner, when the thickness of the piezoelectric substrate 10 is about 2p or less, an advantageous effect that a Q factor and a coupling coefficient of the surface acoustic wave device can be improved is achievable.

In addition to the above components, the acoustic wave device 1 may further include, for example, adhesive layers interposed between the IDT electrode 11 and the piezoelectric substrate 10 and between the reflector 14 and the piezoelectric substrate 10, or a protective layer which covers the IDT electrode and the reflector 14 on the principal surface 10a of the piezoelectric substrate 10. In FIG. 1, illustration of wiring and a pad used to input and output signals to and from the IDT electrode 11 is omitted.

Figure 2A:
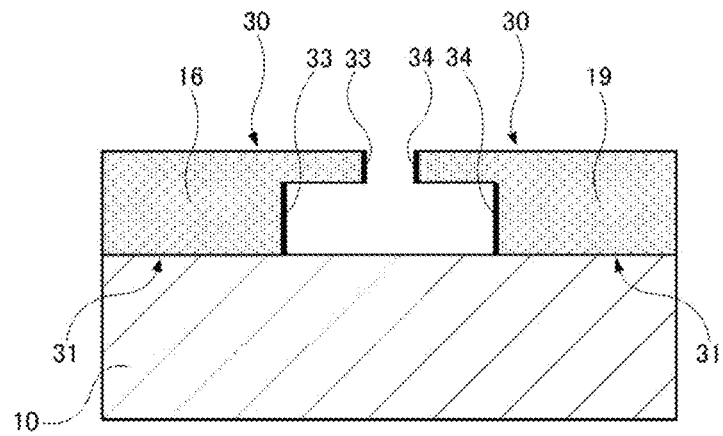
FIGS. 2A to 2C are schematic sectional views of an acoustic wave device according to Preferred embodiment 1 of the present invention.
Figure 2B:
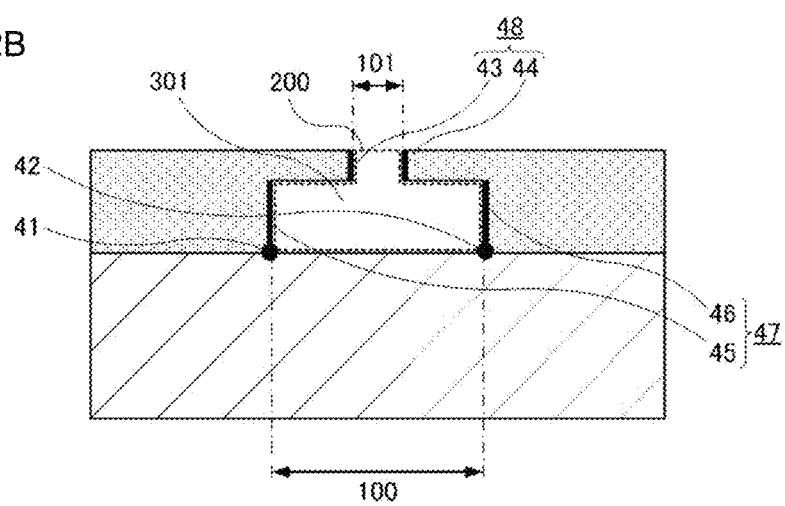
Figure 2C:
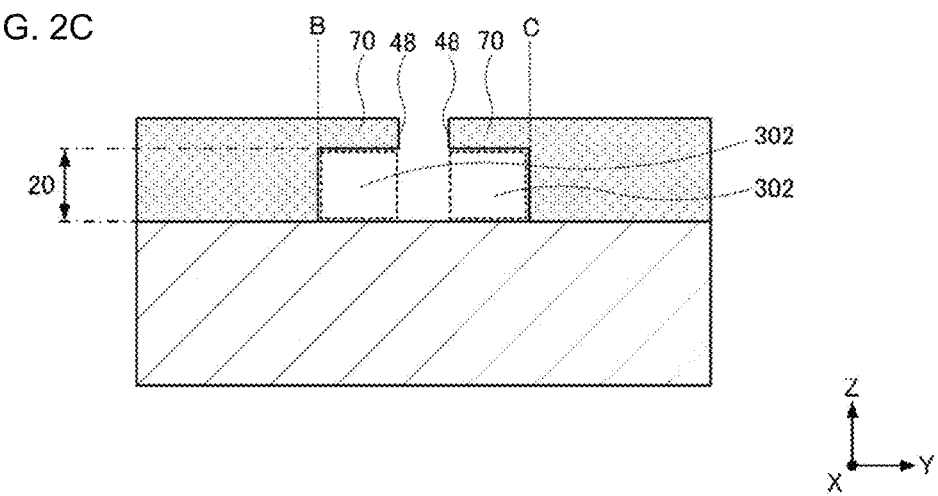

FIGS. 2A to 2C are schematic sectional views of the acoustic wave device according to Preferred embodiment 1 of the present invention. Specifically, FIGS. 2A to 2C are schematic sectional views when the IDT electrode 11 illustrated in FIG. 1 is cut along a line A-A. Here, although the acoustic wave devices illustrated in FIGS. 2A, 2B, and 2B have the same structure, the structure and areas of the acoustic wave device according to Preferred embodiment 1 are described below referring to each drawing.

Although the first busbar electrode 16 and the second electrode fingers 19 are described below in detail, the description is not applicable only to this combination, but also applicable to the combination of the second busbar electrode 18 and the first electrode fingers 17. Since the advantageous effects achieved by preferred embodiments of the present invention are equivalent in any combination, the combination of the first busbar electrode 16 and the second electrode fingers 19 is described herein and in the claims.

As illustrated in FIG. 2A, on the piezoelectric substrate 10, the first busbar electrode 16 of the first comb-shaped electrode 12 and the plurality of second electrode fingers 19 of the second comb-shaped electrode 13 are opposed to each other with the gap 15 therebetween. The gap 15 described herein indicates a space where material of the IDT electrode 11 does not exist between the first busbar electrode 16 and the second electrode fingers 19. In the first busbar electrode 16 and the second electrode fingers 19, a surface on the piezoelectric substrate 10 side is defined as a bottom surface 31, and a surface opposed to the bottom surface 31 is defined as a top surface 30. Further, a surface extending between the top surface 30 and the bottom surface 31 is defined as a side surface. In other words, a surface which is not the top surface or the bottom surface among the surfaces of the IDT electrode 11 is defined as the side surface.

Here, a side surface of the first busbar electrode 16 on the second electrode finger 19 side is a first side surface 33, and a side surface of the second electrode finger 19 on the first busbar electrode 16 side is a second side surface 34. In this case, the first side surface 33 and the second side surface 34 are opposed to each other with the gap 15 therebetween.

Next, as illustrated in FIG. 2B, a contacting portion between the first side surface 33 and the piezoelectric substrate 10 is a first point 41, and a contacting portion between the second side surface 34 and the piezoelectric substrate 10 is a second point 42. When a gap from the first point 41 to the second point 42 is a first gap 100, a first portion 43 and a second portion 44 are opposed to each other with a second gap 101 shorter than the first gap 100 therebetween. Further, a third portion 45 and a fourth portion 46 are opposed each other having the first gap 100 therebetween. Here, the third portion 45 and a fourth portion 46 are one example of a "first opposing portion 47", and the first portion 43 and the second portion 44 are one example of a "second opposing portion 48". A length of the gap in preferred embodiments of the present invention indicates a length in the direction (y-direction) orthogonal or substantially orthogonal to the acoustic wave propagation direction (x-direction).

Moreover, the first portion 43 is located on the top surface 30 side with respect to the first point 41, and the second portion 44 is located on the top surface 30 side with respect to the second point 42. Here, the first portion 43 and the third portion 45 are portions of the first side surface 33, and the second portion 44 and the fourth portion 46 are portions of the second side surface 34. In a schematic sectional view, corresponding portions may be indicated by points or lines. In FIGS. 2A to 2C, portions corresponding to the first portion 43, the second portion 44, the third portion 45, and the fourth portion 46 are indicated by lines.

Further, an area located between the first side surface 33 and the second side surface 34 is referred to as a first area 301. With regard to the first area 301, more accurately, assuming a first imaginary line 200 connecting the top surface 30 of the first busbar electrode 16 to the top surface 30 of the second electrode finger 19, the area surrounded by the first imaginary line 200, the piezoelectric substrate 10, the first busbar electrode 16, and the second electrode finger 19 is the first area 301.

Here, when accurately expressing the first imaginary line 200, the line connecting a portion of the top surface of the first busbar electrode 16, the portion being closest to the opposing second electrode finger 19, to a portion of the top surface of the second electrode finger 19, the portion being closest to the opposing first busbar electrode 16 is referred to as the first imaginary line 200. The top surface 30 of the IDT electrode 11 is flat or substantially flat, thus the first imaginary line 200 of the present application is parallel or substantially parallel to the piezoelectric substrate 10.

A hollow portion as used in the present disclosure indicates a portion not filled with a solid including an insulator or the like, or liquid material. More specifically, for example, the hollow portion indicates a state where gas such as air is primarily provided.

Next, as illustrated in FIG. 2C, in the first area 301 as described above, a hollow portion is provided to a second area 302 located between the piezoelectric substrate 10 and the first busbar electrode 16 or the second electrode finger 19. Specifically, the second area 302 is an area located between the first portion 43 (the second opposing portion 48) and the piezoelectric substrate 10 and an area located between the second portion 44 (the second opposing portion 48) and the piezoelectric substrate 10.

When disclosing that a certain area is "provided with a hollow portion", the hollow portion is not necessarily provided to the entire area. Only a portion of the area being provided with a hollow portion is also included in the case of being "provided with a hollow portion".

Next, portions of the first busbar electrode 16 and the second electrode finger 19 projecting toward the first gap 100 side further than the first point 41 and the second point 42, respectively, are referred to as a convex portion 70. That is, the first portion 43 and the second portion 44 (the second opposing portion 48) are convex portions with respect to the third portion and a fourth portion 46 (the first opposing portion 47), respectively. More accurately, a vertical line B which is vertical or substantially vertical to the piezoelectric substrate 10 and passes through the first point 41 is drawn. Similarly, a vertical line C which is vertical or substantially vertical to the piezoelectric substrate 10 and passes through the second point 42 is drawn. Then, in the first busbar electrode 16 and the second electrode finger 19, portions existing in an area between the two vertical lines B and C are referred to as the convex portion 70.

That is, at least one of the area between the convex portion 70 of the first busbar electrode 16 and the piezoelectric substrate 10 and the area between the convex portion 70 of the second electrode finger 19 and the piezoelectric substrate 10 includes a hollow portion.

That is, the first side surface 33 of the first busbar electrode 16 and the second side surface 34 of the second electrode finger 19, which are opposed to each other with the gap 15 therebetween, are respectively provided with the convex portions 70 projecting toward the gap 15 side from the portions separated from the piezoelectric substrate 10 such that the distance of the gap 15 becomes shorter at the portion separated from the piezoelectric substrate 10 compared to at the first point 41 and the second point 42 in contact with the piezoelectric substrate 10. Further, the hollow portion exists between the convex portion 70 and the piezoelectric substrate 10.

Here, assuming that a height from the principal surface 10a of the piezoelectric substrate 10 to a surface of the convex portion 70 on the piezoelectric substrate side is a first height 20, the first heights 20 from the principal surface 10a of the piezoelectric substrate 10 to the surface of the convex portion 70 derived from the first busbar electrode 16 and to the surface of the convex portion 70 derived from the second electrode finger 19 on the piezoelectric substrate side, respectively, are structured to be equal or substantially equal from the viewpoint of the manufacturing method. However, when the first heights 20 are different, the shorter one is referred to as the first height 20.

Figure 3A:
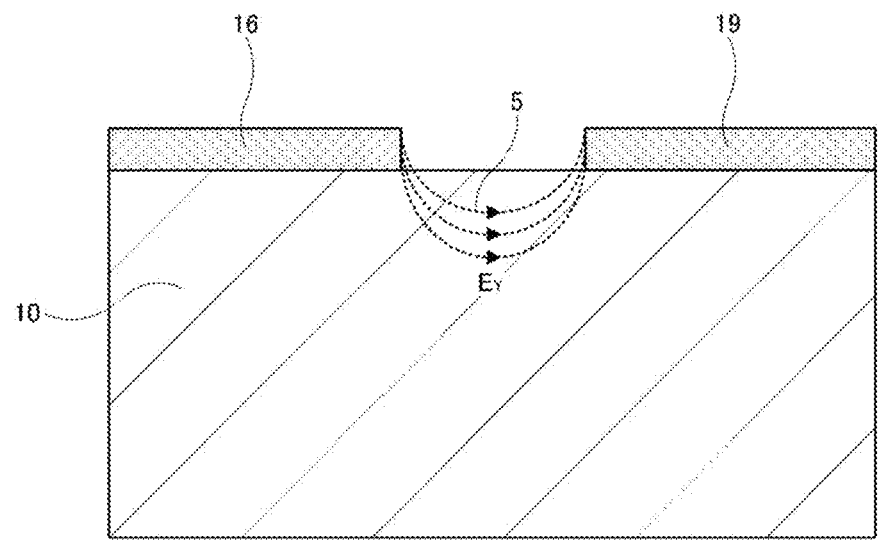
FIGS. 3A and 3B are views illustrating action of the acoustic wave device of FIG. 1.
Figure 3B:
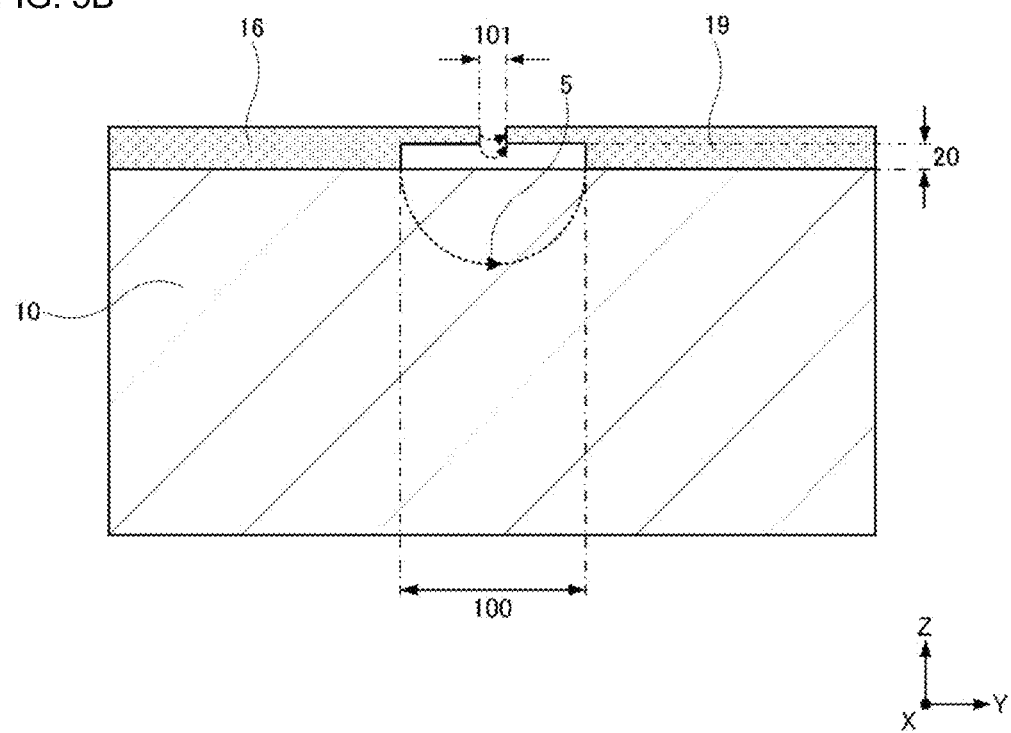

With reference to FIGS. 1, 3A, and 3B, a mechanism in which an electric distorted wave generated due to nonlinearity of the surface acoustic wave element is caused and a principle of reducing or preventing the distorted wave by preferred embodiments of the present invention are described below.

In FIG. 1, the first comb-shaped electrode 12 has an electric potential higher than that of the second comb-shaped electrode 13. Here, an electric field E is caused in an area between the first comb-shaped electrode 12 and the second comb-shaped electrode 13 of the piezoelectric substrate 10. That is, an electric field Ex in the acoustic wave propagation direction (x-direction) and, in the gap area, an electric field Ey in the direction (y-direction) orthogonal or substantially orthogonal to the acoustic wave propagation direction are generated. Then, when such an electric field E is generated, distorted current occurs due to the nonlinearity of the piezoelectric substrate 10 made of the piezoelectric material.

Specifically, when an electric field is applied to the piezoelectric substrate, distorted current corresponding to the electric field flows due to second-order nonlinearity of the permittivity of the piezoelectric substrate 10. In accordance with this mechanism, in the actual surface acoustic wave element, an electric field is excited inside a piezoelectric crystal by the IDT electrode provided on a surface of the piezoelectric crystal, and the electric field has a component in the direction parallel or substantially parallel to the principal surface 10a of the piezoelectric substrate 10 and a component in the direction vertical or substantially vertical to the principal surface 10a (depth direction). The nonlinearity of the permittivity having anisotropy corresponds to the electric field, thus distorted current arising correspondingly is generated.

Here, focusing on a distorted current Ix in the x-direction attributed to the electric field Ex, since a distorted current Ixin flowing in the first electrode finger 17 and a distorted current Ixout flowing out from the first electrode finger 17 are in the opposite directions in the y-direction, the distorted currents Ix flowing between first electrode fingers 17 cancel out each other. Therefore, the distorted wave based on the distorted current Ix is not outputted to the outside of the acoustic wave device 1. Similarly, also with the second electrode fingers 19, the distorted currents Ix cancel out each other. Therefore, the distorted currents Ix in the x-direction in the IDT electrode 11 cancel out each other, thus not being outputted to the outside of the acoustic wave device 1 as a distorted wave.

On the other hand, focusing on the electric field Ey in the y-direction, since distorted currents Iy attributed to the electric field Ey in the gap 15 are in the same direction, the distorted currents Iy do not cancel out each other.

As described above, the distorted currents Iy which remain without mutually being canceled out are considered to be one factor that causes the distorted wave in the gap 15.

Meanwhile, the principle of reducing or preventing the distorted wave by preferred embodiments of the present invention is described with reference to FIGS. 3A and 3B. FIGS. 3A and 3B are sectional views when the IDT electrode 11 illustrated in FIG. 1 is cut along the line A-A, where FIG. 3A is a sectional view of a conventional acoustic wave device, and FIG. 3A is a sectional view of the acoustic wave device according to the present preferred embodiment.

As illustrated in FIG. 3A, in the general acoustic wave device, the length of the gap remains substantially constant from the bottom surface to the top surface. Therefore, the electric field Ey having an equal or substantially equal penetration depth (a length in the z-direction) is generated in the gap 15. The penetration depth indicates a length of a z-axis component from the minimum value to the maximum value in an arbitrary electric field Ey. In the piezoelectric substrate 10, since the electric field may pass more on the upper surface side of the piezoelectric substrate 10 closer to an electrode finger, the electric field Ey becomes larger on the upper surface side of the piezoelectric substrate 10.

On the other hand, as illustrated in FIG. 3B, electric field in a mode where the second gap 101 having the length shorter than that of the gap between the bottom surfaces 31 of the comb-shaped electrodes (that is, the length of the first gap 100) exists on the top surface 30 side of the comb-shaped electrode with respect to the first gap 100. The penetration depth of the electric field in the gap is equal or substantially equal to the length of the gap. Thus, the penetration depth of the electric field becomes shorter in a portion having a shorter gap length compared with a portion having a longer gap length. Because of such a configuration, a penetration depth of an electric field 5 generated in the second gap 101 can be made shorter than that illustrated in FIG. 3A, and it is difficult for the electric field generated in the second gap 101 to reach the piezoelectric substrate 10.

As a result, although there is an influence of the distorted wave due to the electric field generated in the first gap 100, an influence of the distorted wave due to the electric field generated in the second gap 101 can be made smaller. Therefore, a total amount of the electric field which may reach the piezoelectric substrate decreases, thus reducing or preventing the influence of the distorted wave.

With such features, compared with the acoustic wave device illustrated in FIG. 3A, the acoustic wave device illustrated in FIG. 3B, which is one of the preferred embodiments of the present invention, can achieve the advantageous effect that the electric field Ey generated in the piezoelectric substrate 10 is reduced.

In addition, even if the electric field generated between the side surface of the first busbar electrode 16 and the side surface of the second electrode finger 19 which are opposed to each other with the second gap 101 therebetween may reach the piezoelectric substrate 10, by passing through the hollow portion disposed in the second area and including air having a comparatively low permittivity, the advantageous effect that the intensity of the electric field is reduced can be achieved. As described above, since the electric field Ey generated in the gap is considered to be one factor of generating the distorted wave, the reduction in the intensity of the electric field Ey can also result in the reduction or prevention of the distorted wave.

Here, the electric field generated in the gap means, in detail, an electric field generated in an area of the piezoelectric substrate immediately below the gap.

Further, by a relationship between the length defined by the second gap 101 and the length defined by the first height 20, the electric field entering the piezoelectric substrate can further be reduced. Specifically, by making the value of the distance of the first height 20 larger than the value of the length of the second gap 101, the electric field entering the piezoelectric substrate can further be reduced. As described above, the penetration depth of the electric field in the gap is equal or substantially equal to the length of the gap.

Therefore, by making the value of the distance of the first height 20 larger than the value of the length of the second gap 101, the advantageous effect that the electric field generated at the convex portion 70 becomes unlikely to reach the piezoelectric substrate can be achieved.

Modifications of Preferred Embodiment 1

Modifications of Preferred Embodiment 1 are described below.

Acoustic wave devices according to the modifications are described focusing on a portion different from the acoustic wave device 1 according to Preferred Embodiment 1, and description of the configurations that are the same as or similar to the acoustic wave device 1 is omitted.

Figures 4A, 4B, 4C, 4D, 4E:
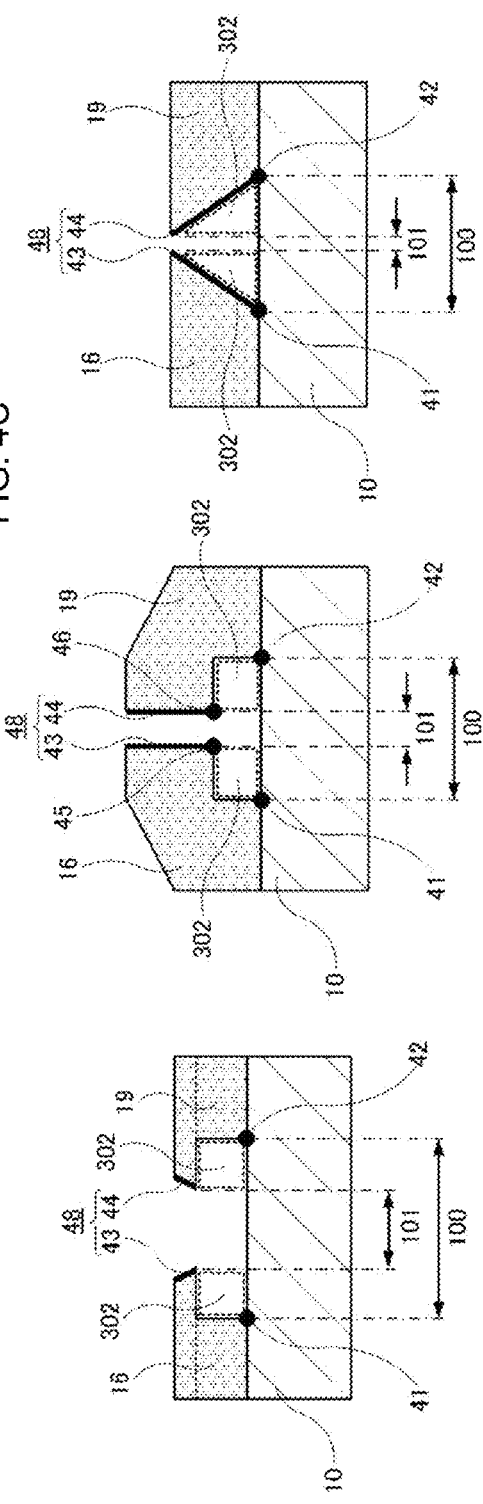
FIGS. 4A to 4E are schematic sectional views illustrating modifications of the acoustic wave device according to Preferred embodiment 1 of the present invention.

Modification 1 of Preferred Embodiment 1 is illustrated in FIG. 4B. The side surface of the first busbar electrode 16 and the side surface of the second electrode finger 19 which are opposed to each other with the second gap 101 therebetween are no necessarily parallel or substantially parallel to each other, and may be mutually inclined. Also in this case, advantageous effects the same as or similar to Preferred Embodiment 1 can be achieved.

In Modification 1, the gap length does not continuously become shorter from the piezoelectric substrate 10 toward the top surface 30 (the first imaginary line 200) of the IDT electrode 11, but becomes shorter in a phased manner. "The gap length becomes shorter in a phased manner" indicates a state in which the portion of each of the first busbar electrode 16 and the second electrode finger 19 projecting toward a gap portion has a step shape and the gap length does not change smoothly.

When a plurality of gaps shorter than the first gap 100 exist, the shortest gap is defined as the second gap 101. In addition, in the first side surface and the second side surface, the first portion 43 and the second portion 44 opposed to each other with the second gap 101 therebetween correspond to the second opposing portion 48.

Next, in a Modification 2 of Preferred Embodiment 1 as illustrated in FIG. 4B, the entire top surface 30 of the IDT electrode 11 including the first busbar electrode 16 and the second electrode finger 19 is not necessarily parallel or substantially parallel to the piezoelectric substrate 10, and may be partially inclined to each other. From a different viewpoint, the IDT electrode 11 is not limited to have a shape in which the distance from the principal surface 10*a* of the piezoelectric substrate 10 to the top surface 30 of the IDT electrode 11 is constant. Here, in a shape in which the gap becomes shorter in a phased manner, the second opposing portion 48 corresponds to the first portion 43 and the second portion 44 of the first side surface and the second side surface, the first portion 43 and the second portion 44 being side surfaces on the top surface side when the first side surface and the second side surface are each divided into two. Also in this case, advantageous effects the same as or similar to Preferred Embodiment 1 can be achieved.

Further, in Modification 2, a portion 45 of the second opposing portion 48 in the first side surface 33, the portion 45 being closest to the piezoelectric substrate 10, and a portion 46 of the second opposing portion 48 in the second side surface 34, the portion 46 being closest to the piezoelectric substrate 10, are both exposed to a hollow. Since the intensity of the electric field generated in the gap becomes higher in inverse proportion to the length of the gap, the intensity of the electric field derived from the second opposing portion 48 becomes higher in the electric field intensity generated in the gap. In addition, the electric field generated between portions close to the piezoelectric substrate 10 reaches the piezoelectric substrate 10 more easily than the electric field generated between portions far from the piezoelectric substrate 10. Therefore, by exposing the above-described portion of the second opposing portion 48 closest to the piezoelectric substrate 10 to the hollow portion including air having a comparatively low permittivity, an advantageous effect that the intensity of the electric field is further reduced can be achieved. However, both of the second opposing portions 48 in the first side surface 33 and the second side surface 34 closest to the piezoelectric substrate 10 are not necessarily exposed to the hollow portion, as long as at least one of them is exposed thereto.

In terms of the hollow portion to which the above-described portions of the second opposing portion 48 in the first side surface 33 and the second side surface 34, the portions being closest to the piezoelectric substrate 10, are exposed, the hollow portion may be identical or substantially identical to the hollow disposed in the second area 302 as in Modification 2, or may be different from the hollow portion disposed in the second area 302.

A Modification 3 of Preferred Embodiment 1 is illustrated in FIG. 4C. The gap length may become shorter continuously rather than in a phased manner from the piezoelectric substrate 10 toward the top surface 30 (the first imaginary line 200). More specifically, the side surfaces of the first busbar electrode 16 and the second electrode finger 19 which are opposed to each other with a gap therebetween may have a mutually inclined shape. In Modification 3, the first side surface 33 except for the first point 41 corresponds to the first portion 43, and the second side surface 34 except for the second point 42 corresponds to the second portion 44. Also in such a structure, similarly to Preferred Embodiment 1, the penetration depth of the electric field in the gap becomes shorter, and thus, the advantageous effect that the electric field in the gap becomes unlikely to reach the piezoelectric substrate is achieved.

Here, in Modification 3, a portion where the first side surface 33 contacts the top surface 30 of the first busbar electrode 16 and a portion where the second side surface 34 contacts the top surface 30 of the second electrode finger 19 are both exposed to a hollow portion. As described above, by allowing the electric field which easily reaches the piezoelectric substrate 10 and is high in the electric field intensity to pass through air having a low permittivity, the advantageous effect that the intensity of the electric field is further reduced can be achieved. However, both of the portion where the first side surface 33 contacts the top surface 30 of the first busbar electrode 16 and the portion where the second side surface 34 contacts the top surface 30 of the second electrode finger 19 are not necessarily exposed to the hollow portion, as long as at least one of them is exposed thereto. Further, the hollow portion is not necessarily identical or substantially identical to the hollow portion disposed in the second area 302. In a Modification 4 of Preferred Embodiment 1, the gap length may continuously become shorter partially from the piezoelectric substrate 10 toward the top surface 30 as illustrated in FIG. 4D, rather than continuously becoming shorter entirely from the piezoelectric substrate 11 toward the top surface 30. Specifically, here, a certain gap length is maintained from the piezoelectric substrate 11 toward an intermediate point on the way to the top surface 30, and from this point toward the top surface 30, the gap has an arc shape in which the gap distance continuously becomes shorter than the first gap 100. However, one example of the shape in which the gap length continuously becomes shorter is described here, and it is not necessarily limited to the arc shape as illustrated.

Here, the first portion 43 in Modification 4 is a portion of the first side surface 33 illustrated by a curved line, and also the second portion 44 is a portion of the second side surface 34 illustrated by a curved line. The first portion 43 and the second portion 44 are opposed to each other with a gap shorter than the first gap 100 therebetween.

As illustrated in FIG. 4D, also with the shape in which the gap length continuously becomes shorter partially from the piezoelectric substrate 11 toward the top surface 30, the advantageous effect that the electric field in the gap becomes unlikely to reach the piezoelectric substrate 11 can be achieved similarly to Preferred Embodiment 1.

Although, in Preferred Embodiment 1 described above, both of the first busbar electrode 16 and the second electrode finger 19 disposed on the piezoelectric substrate 10 have the characteristic shapes, it is not limited to this.

For example, a Modification 5 of Preferred Embodiment 1 is illustrated in FIG. 4E. As in an acoustic wave device illustrated in FIG. 4E, among the comb-shaped electrodes opposed to each other, only the first busbar electrode 16 on one side may include the convex portion 70 and the second electrode finger 19 on the other side may not include the convex portion 70. Also in this case, since the second gap 101 is shorter than the first gap 100 on the top surface 30 side, the advantageous effect that the electric field in the gap becomes unlikely to reach the piezoelectric substrate 11 can be achieved. Although here the configuration in which only the first busbar electrode 16 is provided with the convex portion 70 is illustrated, only the second electrode finger 19 may be provided with the convex portion 70.

In Modification 5, the gap length becomes shorter from the piezoelectric substrate 10 toward the top surface 30 of the IDT electrode 11 in a phased manner. Here, the second opposing portion 48 in Modification 5 is described. First, in the first side surface 33 of the first busbar electrode 16, the first portion 43, which is the side surface on the top surface side, of the side surfaces divided into two corresponds to the second opposing portion 48. Meanwhile, in the second side surface 34 of the second electrode finger 19, the second portion 44 which is opposed to the second opposing portion 48 of the first busbar electrode 16 with the second gap 101 therebetween corresponds to the second opposing portion 48.

In other words, in preferred embodiments of the present invention, the electrodes opposed to each other with the gap therebetween (for example, the first busbar electrode 16 and the second electrode finger 19) are not necessarily line symmetric with respect to a vertical line passing through the midpoint of the first gap 100. Even when they are not line symmetric, the desired advantageous effects can be achieved as long as the second gap 101 shorter than the first gap 100 is provided on the top surface 30 side of the first busbar electrode 16 or the second electrode finger 19.

Manufacturing Method

Next, one non-limiting example of a manufacturing method of the acoustic wave device is described with reference to FIGS. 5A to 5D and 6E to 6G. FIGS. 5A to 5D and FIGS. 6E to 6G are sectional views arranged in an order of manufacturing process of the surface acoustic wave element, and correspond to the sectional view when cut along the line A-A in FIG. 1. The manufacturing process advances as illustrated in FIGS. 5A to 5D and FIGS. 6E to 6G in order. Although the shape or the like of each layer changes as the process advances, common reference numerals may be used before and after the change.

Figure 5A:
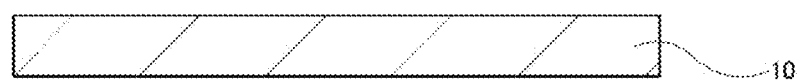
FIGS. 5A to 5D are views illustrating a manufacturing method of the acoustic wave device according to Preferred embodiment 1 of the present invention.

As illustrated in FIG. 5A, the piezoelectric substrate 10 is prepared.

Figure 5B:
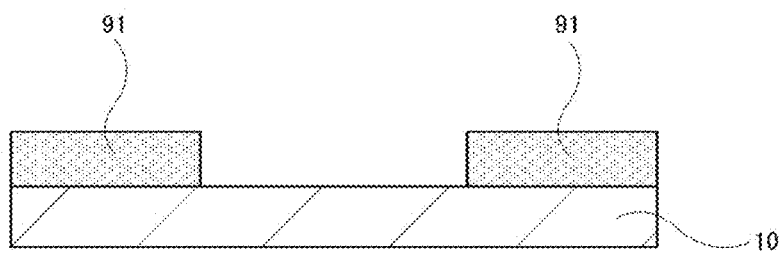

Next, as illustrated in FIG. 5B, a first electrode film 91 is formed on the principal surface 10a of the piezoelectric substrate 10 using, for example, a photolithographic technique or an etching technique. The first electrode film 91 becomes a portion of electrode patterns including the IDT electrode 11, the reflector 14, and the like.

A method of forming the IDT electrode 11 and the reflector 14 is not limited to photolithographic processing, but etching processing including, for example, film forming, resist patterning, etching, and resist stripping in this order may be used. At this time, a thin passivation film (such as $SiO_2$ and SiN) may be provided in order to reduce or prevent corrosion of the IDT electrode 11.

Figure 5C:
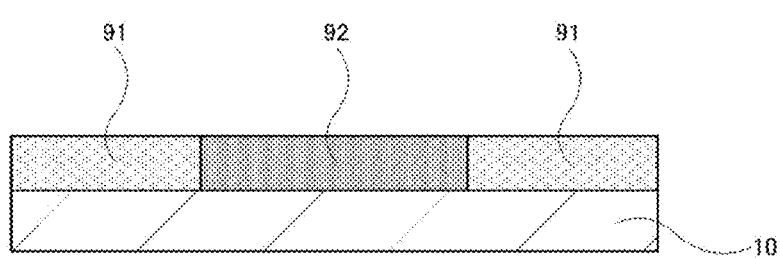

Next, as illustrated in FIG. 5C, a sacrificial layer 92 is provided to the gap 15 of the first electrode film 91 generated through the processing up to FIG. 5B. A material of the sacrificial layer 92 is, for example, PI or ZnO, but is not limited to this.

Figure 5D:
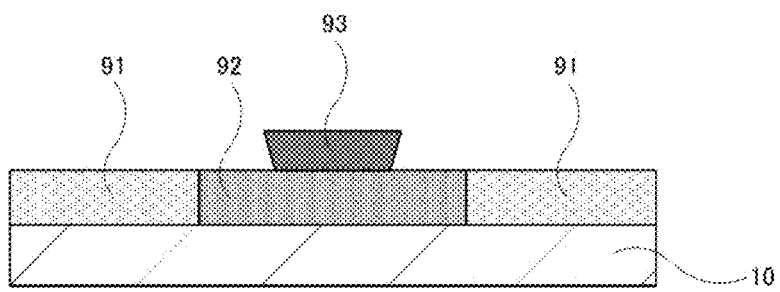

Then, as illustrated in FIG. 5D, a resist pattern 93 is formed such that its length becomes shorter than the sacrificial layer 92 in the direction (y-direction) orthogonal or substantially orthogonal to the acoustic wave propagation direction.

Figure 6E:
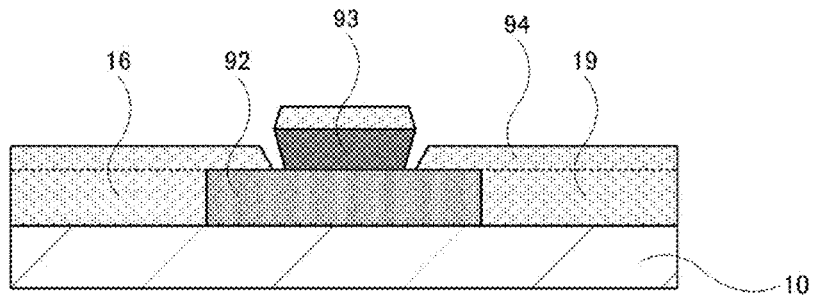
FIGS. 6E to 6G are views illustrating the manufacturing method of the acoustic wave device according to Preferred embodiment 1 of the present invention.

Then, as illustrated in FIG. 6E, a second electrode film 94 made of electrode material (for example, Al) is formed on the resist pattern 93 and the first electrode film 91 by using a method of, for example, vapor deposition, sputtering, or the like.

Figure 6F:
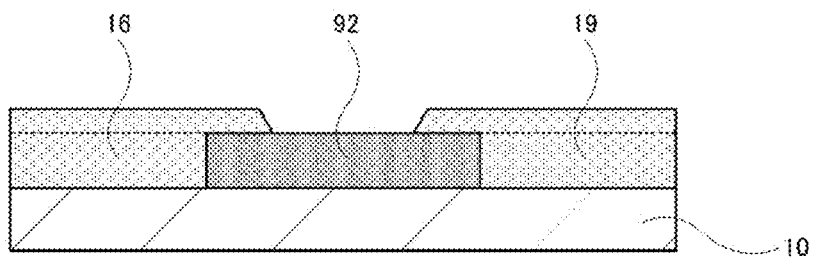

Next, as illustrated in FIG. 6F, the resist pattern 93 is dissolved by a solvent, and an unnecessary electrode film attached thereon is removed.

Figure 6G:
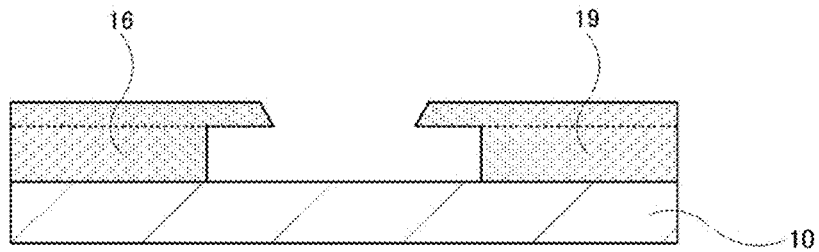

Similarly, the sacrificial layer 92 is also removed. Therefore, the configuration in which the second electrode film 94 including the electrode material (for example, Al) is laminated on the first electrode film 91 can be made, as illustrated in FIG. 6G.

Preferred Embodiment 2

Figure 7A:
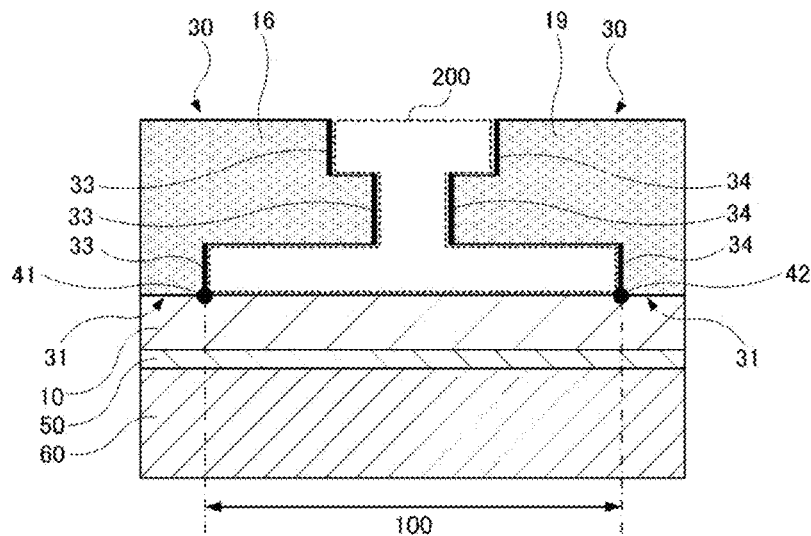
FIGS. 7A to 7C are schematic sectional views of an acoustic wave device according to Preferred embodiment 2 of the present invention.
Figure 7B:
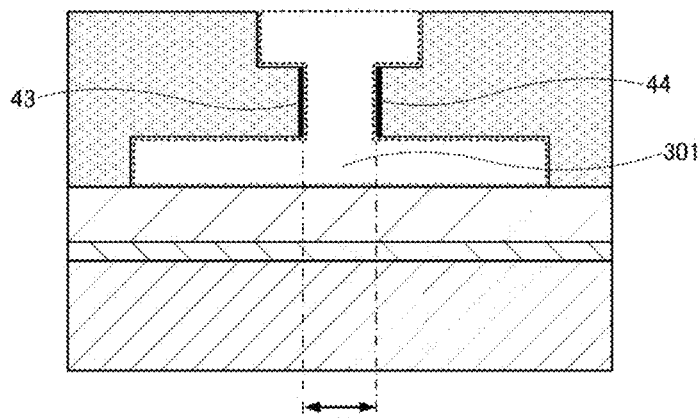
Figure 7C:
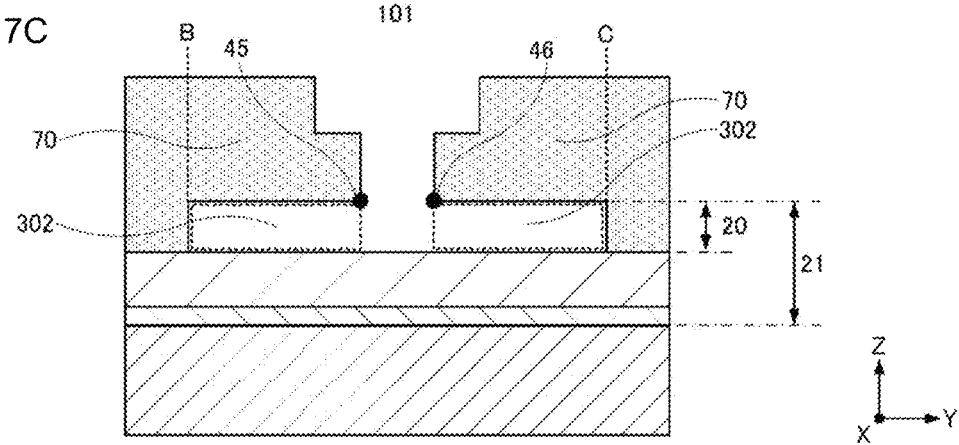

FIGS. 7A to 7C are schematic sectional views of the acoustic wave device 1 according to Preferred Embodiment 2 of the present invention.

In the following description, members having functions common or substantially common with Preferred embodiment 1 are referred to by common reference characters, and description thereof is omitted.

FIGS. 7A, 7B, and 7C illustrate Preferred Embodiment 2, and the present preferred embodiment will be apparent by a structure of the acoustic wave device according to Preferred Embodiment 2 being illustrated separately in each drawing.

First, in FIG. 7A, on the piezoelectric substrate 10, the first busbar electrode 16 of the first comb-shaped electrode 12 and the plurality of second electrode fingers 19 of the second comb-shaped electrode 13 are at least partially opposed to each other with the gap 15 therebetween. In the first busbar electrode and the second electrode fingers 19, the surface on the piezoelectric substrate 10 side is defined as the bottom surface 31, and the surface opposed to the bottom surface 31 is defined as the top surface 30. Further, assuming that the surface connecting the top surface and the bottom surface is the side surface, the side surface of the first busbar electrode 16 on the second electrode finger 19 side is the first side surface 33, and the side surface of the second electrode finger 19 on the first busbar electrode 16 side is the second side surface 34. Here, the first side surface 33 and the second side surface 34 are opposed to each other with a gap therebetween.

The portion (the second opposing portion 48) where the first busbar electrode 16 and the second electrode finger 19 are opposed to each other with the second gap 101 shorter than the first gap 100 (the gap between the first point 41 and the second point 42) therebetween is provided on the top surface 30 side with respect to the first gap 100.

In FIG. 7B, a plurality of portions where the first busbar electrode 16 and the second electrode finger 19 are opposed to each other with a gap shorter than the first gap 100 therebetween are provided on the top surface 30 side with respect to the first gap 100. Therefore, a plurality of gaps shorter than the first gap 100 exist. In this case, the gap with the shortest length between the opposing first busbar electrode 16 and the second electrode finger 19 is defined as the second gap 101. Further, in a configuration like the present preferred embodiment in which the gap length becomes shorter in a phased manner from the piezoelectric substrate 10 toward the first imaginary line 200, the first portion 43 included in the side surface of the first busbar electrode 16 and the second portion 44 included in the side surface of the second electrode finger 19 are defined as the second opposing portion 48. The first portion 43 and the second portion 44 are opposed to each other with the second gap 101 therebetween. Referring to FIG. 7B, when each of the first side surface 33 and the second side surface 34 is divided into three, a side surface at the middle in the thickness direction of the piezoelectric substrate 10 corresponds to the second opposing portion 48 (43, 44). Further, the first area 301 which is the area between the first side surface 33 and the second side surface 34 exists.

Next, referring to FIG. 7C, in the first area 301 described above, a hollow portion is provided to the second area 302 located between the piezoelectric substrate 10 and the first busbar electrode 16 or the second electrode finger 19.

Also in Preferred Embodiment 2, the second gap 101 shorter than the first gap 100 where portions of the closest to the bottom surface 31 of the first busbar electrode 16 and the second electrode finger 19 are opposed to each other is provided on the top surface 30 side with respect to the first gap 100. Therefore, by reducing the penetration depth of the electric field generated in the gap as described above, the electric field which may reach the piezoelectric substrate can be reduced. Further, even when the electric field generated at the side surface of the first busbar electrode 16 and the side surface of the second electrode finger 19 reaches the piezoelectric substrate 10, by passing it through the hollow portion which is disposed in the second area 302 and includes air with a comparatively low permittivity, the advantageous effect that the intensity of the electric field can be reduced similarly to Preferred Embodiment 1 is achievable.

As illustrated in FIGS. 7A to 7C, the piezoelectric substrate 10 is provided with a middle layer 50 and a semiconductor layer 60 corresponding to a supporting substrate so as to be laminated on a principal surface opposed to the principal surface 10a where the IDT electrode 11 is disposed. The semiconductor layer is made of silicon, for example.

Further, the middle layer 50 may be provided between the piezoelectric substrate 10 and the semiconductor layer 60. By the middle layer 50 being provided, the electromechanical coupling coefficient can be increased, thus an advantageous effect that deterioration in characteristics can be reduced or prevented being achieved.

In terms of the convex portion 70 defined similarly to Preferred Embodiment 1 described above, a height from an interface between the middle layer 50 and the supporting substrate made of the semiconductor layer 60 or the like to the surface of the convex portion 70 on the piezoelectric substrate 10 side is a second height 21. Here, when the second height 21 from the interface between the middle layer 50 and the semiconductor layer 60 to the convex portion derived from the first busbar electrode 16 is different from the second height 21 from the forementioned interface to the convex portion derived from the second electrode finger 19, the shorter one is preferably defined as the second height 21. In this case, when the value of the second height 21 is larger than the value of the length of the second gap 101, the advantageous effect that the distorted wave derived from the semiconductor layer is further reduced can be achieved. The advantageous effect is caused as the electric field which may reach the semiconductor layer is reduced by utilizing the fact that the penetration depth of the electric field in the gap is equal or substantially equal to the length of the gap.

Here, one non-limiting example of a manufacturing method of the acoustic wave device according to Preferred Embodiment 2 is described. A basic manufacturing process is the same as or similar to the manufacturing method of the acoustic wave device according to Preferred Embodiment 1 described above. First, the manufacturing process advances as illustrated in FIGS. 5A to 5D and FIGS. 6E and 6F in order.

Then, when FIG. 6F is completed, again in the same or substantially the same way as illustrated in FIG. 5D, the resist pattern 93 is formed on the second electrode film 94 and the sacrificial layer 92 so as to bridge the second electrode film 94, and then a third electrode film is formed.

Next, similarly to the process illustrated in FIGS. 6F and 6G, by removing the resist pattern 93 and the sacrificial layer 92 in order, the configuration as illustrated in FIGS. 7A to 7C where the third electrode film is laminated on the first electrode film 91 and the second electrode film 94 is obtained.

Preferred Embodiment 3

Figure 8:
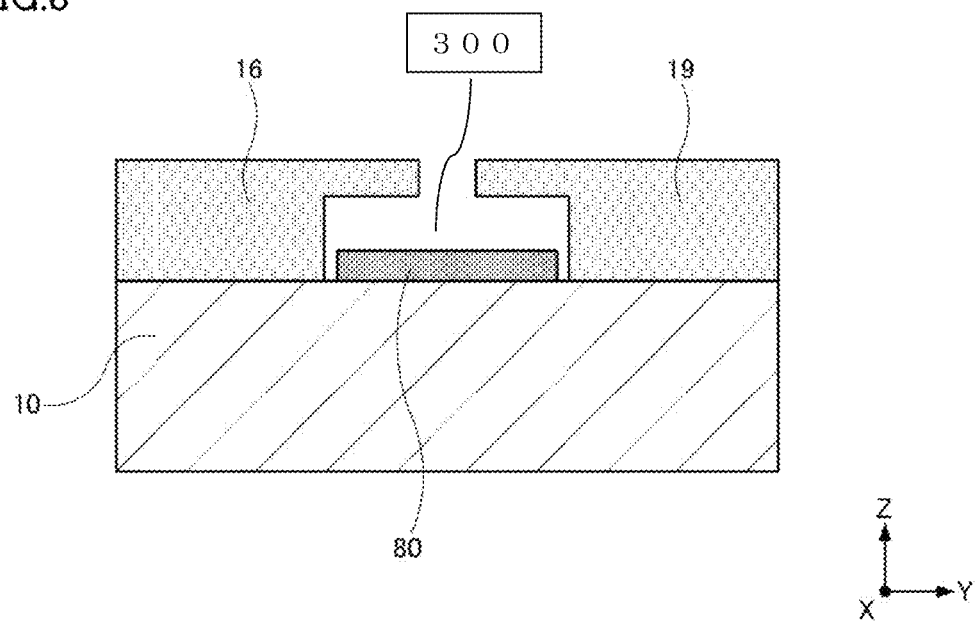
FIG. 8 is a schematic sectional view of an acoustic wave device according to Preferred embodiment 3 of the present invention.

FIG. 8 is a schematic sectional view of the acoustic wave device 1 according to Preferred Embodiment 3 of the present invention.

For example, in the acoustic wave device as illustrated in FIG. 8, in addition to a configuration the same as or similar to Preferred Embodiment 1, an additional film 80 is provided to an area 300 surrounded by the first imaginary line 200, the piezoelectric substrate 10, the first busbar electrode 16, and the second electrode finger 19. For example, the additional film 80 is disposed on the principal surface 10a of the piezoelectric substrate 10.

The additional film 80 is made of a metallic layer which is not electrically connected to the pair of comb-shaped electrodes. In this case, a portion of the electric field generated in the gap passes through the metallic layer. Therefore, compared with the configuration before being provided with the additional film, the electric field which may reach the piezoelectric substrate 10 is reduced, and the distorted wave is reduced or prevented.

Further, the additional film 80 may be a dielectric including at least one of, for example, tantalum oxide, hafnium oxide, and zirconia and having a permittivity lower than that of the piezoelectric substrate 10. In this case, the electric field generated in the gap is likely to concentrate on the additional film, and compared with the configuration without the additional film, the electric field generated in the gap becomes unlikely to reach the piezoelectric substrate 10. As a result, the electric field generated in the gap is reduced, and the distorted wave is reduced or prevented. In addition, since a parasitic capacitance in the gap becomes lower than the case where the additional film is the metallic layer, a parasitic effect acting on the acoustic wave device by the additional film is reduced.

Further, Japanese Unexamined Patent Application Publication No. 2014-143657 discloses a configuration in which the additional film 80 is disposed between the IDT electrode 11 and the piezoelectric substrate 10. However, in Preferred Embodiment 3, the additional film 80 is not disposed between the IDT electrode 11 and the piezoelectric substrate 10. In other words, in the present preferred embodiment, the IDT electrode 11 is directly provided on the piezoelectric substrate 10. Generally, the area between the IDT electrode 11 and the piezoelectric substrate 10 has an influence on the electrical characteristics. While the additional film is disposed in that dominant area in Japanese Unexamined Patent Application Publication No. 2014-143657, in the present preferred embodiment, the additional film is not disposed therein. Therefore, compared with Japanese Unexamined Patent Application Publication No. 2014-143657, the electromechanical coupling coefficient can be increased, and the advantageous effect that deterioration of electrical characteristics is reduced or prevented can be achieved.

Here, one non-limiting example of a manufacturing method of the acoustic wave device according to Preferred Embodiment 3 is described. A basic manufacturing process follows the manufacturing method of the acoustic wave device according to Preferred Embodiment 1 described above. First, the manufacturing process advances from FIG. 5A to FIG. 5B.

Next, the additional film 80 is provided in the gap 15 of the first electrode film 91 formed through the processing up to FIG. 5B. A material of the additional film 80 is, for example, tantalum oxide, hafnium oxide, and zirconia.

Next, as illustrated in FIG. 5C, the sacrificial layer 92 is provided in the gap 15 of the first electrode film 91 so as to cover the additional film 80. Then, the process advances as illustrated in FIG. 5D and FIGS. 6E to 6G in order, and therefore, the configuration as illustrated in FIG. 8 where the additional film 80 is provided in the area 300 is obtained.

Other Modifications

An acoustic wave device according to a preferred embodiment of the present invention may have a configuration in which, for example, a plurality of acoustic wave devices are disposed on a single piezoelectric substrate.

Further, in the preferred embodiments and modifications described above, the acoustic wave device including the surface acoustic wave device is illustrated. However, the acoustic wave in the preferred embodiments and modifications described above includes an acoustic wave which propagates to the surface of the composite substrate or to an interface of a plurality of material, and indicates various acoustic waves which are excited by the IDT electrode. For example, the acoustic wave includes a Love wave, a leaky wave, a Rayleigh wave, a pseudo SAW, and a plate wave.

The preferred embodiments and modifications disclosed herein are merely illustrative from all the viewpoints, and should not be considered as limitations. The scope of the present invention is indicated by the claims, and not by the preferred embodiments and modifications described above, and all of the changes within a meaning and a scope equivalent to the claims are intended to be included in the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric substrate; and
an IDT electrode on the piezoelectric substrate; wherein the IDT electrode includes:
    a pair of busbar electrodes opposed to each other; and
    a plurality of electrode fingers;
each of the plurality of electrode fingers is connected at one end portion to one of the pair of busbar electrodes, and is opposed at another end portion to another one of the pair of busbar electrodes with a gap therebetween;
at least one of an opposing surface of at least one of the pair of busbar electrodes and an opposing surface of at least one of the plurality of electrode fingers, the opposing surfaces being opposed to each other with the gap therebetween, is provided with a convex portion projecting toward a gap side from a portion spaced away from the piezoelectric substrate such that a distance of the gap is shorter at the portion spaced away from the piezoelectric substrate compared to at a portion in contact with the piezoelectric substrate; and
a hollow portion is provided between the convex portion and the piezoelectric substrate.

2. An acoustic wave device comprising:
a piezoelectric substrate; and
an IDT electrode on the piezoelectric substrate; wherein the IDT electrode includes:
    a first busbar electrode and a second busbar electrode opposed to each other;
    a first electrode finger extending from the first busbar electrode toward the second busbar electrode; and
    a second electrode finger extending from the second busbar electrode toward the first busbar electrode;
when, in the first busbar electrode and the second electrode finger, a surface on a piezoelectric substrate side is a bottom surface, a surface opposed to the bottom surface is a top surface, and a surface connecting the top surface to the bottom surface is a side surface, a first side surface of the first busbar electrode and a second side surface of the second electrode finger are opposed to each other with a gap therebetween, the first side surface being the side surface on a second electrode finger side, the second side surface being the side surface on a first busbar electrode side; and
when the gap from a first point, at which the first side surface contacts the piezoelectric substrate, to a second point, at which the second side surface contacts the piezoelectric substrate is a first gap, the gap from a first portion of the first side surface, the first portion being on a top surface side with respect to the first point, to a second portion of the second side surface, the second portion being on the top surface side with respect to the second point, is a second gap having a length shorter than a length of the first gap; and
in a first area located between the first side surface and the second side surface, a second area located between the piezoelectric substrate and the first busbar electrode or the second electrode finger is provided with a hollow portion.

3. The acoustic wave device according to claim 2, wherein the length of the gap becomes shorter in a phased manner from the piezoelectric substrate toward a first imaginary line connecting the top surface of the first busbar electrode to the top surface of the second electrode finger; and when, in the first side surface and the second side surface, surfaces opposed to each other with the first gap therebetween is a first opposing portion and surfaces opposed to each other with the second gap therebetween is a second opposing portion, at least one of a portion of the second opposing portion in the first side surface and a portion of the second opposing portion in the second side surface is exposed to the hollow portion, the portions being closest to the piezoelectric substrate.

4. The acoustic wave device according to claim 2, wherein the length of the gap becomes shorter continuously from the piezoelectric substrate toward a first imaginary line connecting the top surface of the first busbar electrode to the top surface of the second electrode finger.

5. The acoustic wave device according to claim 4, wherein at least one of a portion at which the first side surface contacts the top surface and a portion at which the second side surface contacts the top surface is exposed to the hollow portion.

6. The acoustic wave device according to claim 3, wherein the second opposing portion is a convex portion with respect to the first opposing portion; and when a height from a principal surface of the piezoelectric substrate on an IDT electrode side to a surface of the convex portion on the piezoelectric substrate side is a first height, a value of the first height is larger than a value of the length of the second gap.

7. The acoustic wave device according to claim 3, wherein the second opposing portion is a convex portion with respect to the first opposing portion;

a supporting substrate made of a semiconductor is laminated on a surface of the piezoelectric substrate, the surface being opposed to a surface on which the IDT electrode is provided; and when a height from a principal surface of the supporting substrate on the piezoelectric substrate side to a surface of the convex portion on the piezoelectric substrate side is a second height, a value of the second height is larger than a value of the length of the second gap.

8. The acoustic wave device according to claim 2, wherein a supporting substrate made of a semiconductor is laminated on a surface of the piezoelectric substrate, the surface being opposed to a surface on which the IDT electrode is provided.

9. The acoustic wave device according to claim 8, wherein the semiconductor is made of material mainly including silicon.

10. The acoustic wave device according to claim 2, wherein the first area on the piezoelectric substrate includes an additional film provided thereon.

11. The acoustic wave device according to claim 10, wherein the additional film is made of a dielectric.

12. The acoustic wave device according to claim 11, wherein a material of the additional film includes at least one of tantalum oxide, hafnium oxide, and zirconia.

13. The acoustic wave device according to claim 12, wherein the additional film is made of a metallic layer not being electrically connected to the IDT electrode.

14. The acoustic wave device according to claim 2, wherein the first busbar electrode includes at least one dummy electrode finger extending toward the second busbar electrode; and one of the at least one dummy electrode finger is opposed to the second electrode finger with the gap therebetween.

15. The acoustic wave device according to claim 2, wherein when, among a plurality of the first electrode fingers, a center-to-center distance between the adjacent first electrode fingers in an acoustic wave propagation direction is an IDT electrode pitch p, a thickness of the piezoelectric substrate is about 2p or less.

16. The acoustic wave device according to claim 6, wherein the second opposing portion is a convex portion with respect to the first opposing portion;

a supporting substrate made of a semiconductor is laminated on a surface of the piezoelectric substrate, the surface being opposed to a surface on which the IDT electrode is provided; and when a height from a principal surface of the supporting substrate on the piezoelectric substrate side to a surface of the convex portion on the piezoelectric substrate side is a second height, a value of the second height is larger than a value of the length of the second gap.

17. The acoustic wave device according to claim 6, wherein a supporting substrate made of a semiconductor is laminated on a surface of the piezoelectric substrate, the surface being opposed to a surface on which the IDT electrode is provided.

18. The acoustic wave device according to claim 17, wherein the semiconductor is made of material mainly including silicon.

19. The acoustic wave device according to claim 18, wherein the additional film is made of a dielectric.

20. The acoustic wave device according to claim 19, wherein a material of the additional film includes at least one of tantalum oxide, hafnium oxide, and zirconia.

* * * * *